United States Patent [19]

Douglas

[11] Patent Number: 5,122,225

[45] Date of Patent: Jun. 16, 1992

[54] SELECTIVE ETCH METHOD

[75] Inventor: Monte A. Douglas, Coppell, Tex.

[73] Assignee: Texas Instruments Incorporated, Dallas, Tex.

[21] Appl. No.: 617,123

[22] Filed: Nov. 21, 1990

[51] Int. Cl.$^5$ .................. B44C 1/22; C03C 15/00; C03C 25/06; C23F 1/02

[52] U.S. Cl. .................. 156/643; 156/646; 156/656; 156/659.1; 156/662; 156/667; 252/79.1

[58] Field of Search .............. 156/643, 646, 652, 653, 156/655, 656, 657, 659.1, 662, 667; 252/79.1; 204/192.32, 192.35; 437/180, 200, 228; 357/23.1, 65, 67

[56] References Cited

U.S. PATENT DOCUMENTS

| | | | |
|---|---|---|---|
| 4,675,073 | 6/1987 | Douglas | 156/643 |
| 4,793,896 | 12/1988 | Douglas | 156/643 |
| 4,821,085 | 4/1989 | Haken et al. | 357/67 |
| 4,863,559 | 9/1989 | Douglas | 156/643 |
| 4,957,590 | 9/1990 | Douglas | 156/643 |

Primary Examiner—William A. Powell
Attorney, Agent, or Firm—Ira S. Matsil; James C. Kesterson; Richard L. Donaldson

[57] ABSTRACT

The invention discloses a method for selectively etching a first material at a faster rate than a second material, where both materials are incorporated on the surface of a semiconductor. The surface is disposed (step 100) in a plasma etcher. A reactant is flowed into the etcher (102). The etch agents are chosen so the chemical products created by a reaction between the etchant and the first material are volatile and the chemical products created by a reaction between the etchant and the second material are non-volatile. A reaction is then ignited (104) and the first material is etched (106). One embodiment discloses a method for forming a local interconnect.

21 Claims, 2 Drawing Sheets

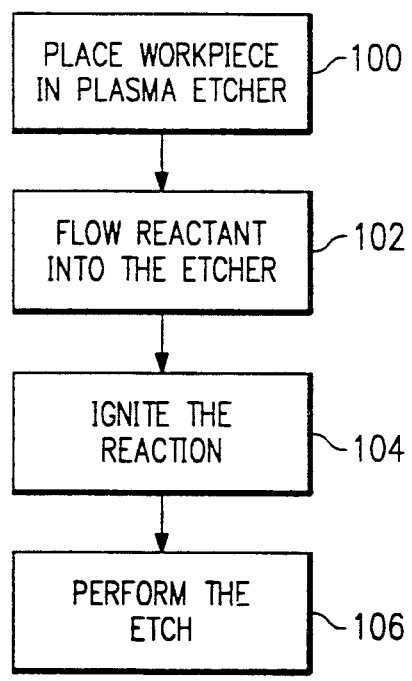

SELECTIVE ETCH METHOD

NOTICE (C) Copyright, *M* Texas Instruments Incorporated 1990. A portion of the disclosure of this patent document contains material which is subject to copyright and mask work protection. The copyright and mask work owner has no objection to the facsimile reproduction by anyone of the patent document or the patent disclosure, as it appears in the Patent and Trademark Office patent file or records, but otherwise reserves all copyright and mask work rights whatsoever.

FIELD OF THE INVENTION

This invention generally relates to semiconductor devices, and in particular to an improved method for forming local interconnects.

BACKGROUND OF THE INVENTION

Increasing the number of levels of interconnects in integrated circuits provides additional routing capabilities, more compact layouts, better circuit performance and greater use of circuit design within a given integrated circuit surface area. A particularly useful level of connection is commonly called local interconnection, where neighboring diffused areas are connected to one another, and to neighboring polysilicon and metal lines.

One local interconnection method is disclosed in U.S. Pat. No. 4,675,073, issued on Jun. 23, 1987. As disclosed therein, the desired local interconnect is formed by patterning the residual titanium compound, for example titanium nitride (TiN), from the direct reaction forming titanium silicide (TiSi$_2$) cladding of the diffusions and polysilicon gates. The titanium nitride is sufficiently conductive so that is useful to make local interconnections between neighboring regions. The disclosed process uses carbon tetrafluoride (CF$_4$) as the reactant in a plasma etch to remove the undesired titanium nitride faster than titanium silicide.

An improved local interconnection method is disclosed in U.S. Pat. No. 4,793,896, issued on Dec. 27, 1988, and U.S. Pat. No. 4,863,559, issued on Sep. 5, 1989. Here a plasma etch using carbon tetrachloride (CCl$_4$) as the etchant is used to etch the titanium nitride anisotropically. The preferred method is to perform the etch with a substrate temperature on the order of 50° C.

Several problems exist with the current art. This chemistry achieves selectivity by the mechanism of polymerization. However, the control of the polymerization is very poor, leading to an unstable process. The control is poor, since the physical processes in the plasma are manipulated to determine reaction pathways and product distributions. Polymer deposition is controlled by substrate temperature, helium flow, carbon tetrachloride flow, power, pressure, reactor configuration, reactor material and other factors. Due to the large number of factors, the process can easily shift without significant reactor care. Moreover, the process latitude is very small due to the large number of strongly interactive parameters and the difficulty discharging carbon tetrachloride gas.

In addition, due to their chemical similarity, it is difficult to etch TiN faster than TiSi$_2$. Further, the TiN:-TiSi$_2$ etch rate ratio decreases with etch time. Also, the dry etch process is difficult to install and maintain in a reactor, since the parameter domain required to achieve selectivity to silicide is small and sensitive to hardware configuration and change.

Another problem exists because the titanium residing on silicon oxide (field and sidewall) reacts with the silicon oxide at high temperature to form an interfacial material thought to be comprised of TiSi$_x$O$_y$. Since this material is a "hybrid" between silicon oxide and titanium silicide, it is difficult to etch, especially when located along the sidewall oxide of a polycide gate. This film is typically removed by means of a wet etch. This approach, however, has a number of shortcomings. The silicide selectivity is not adequate to remove the conductive filaments without unacceptably increasing the silicide sheet resistivity. Also, control of the wet etch is marginal, since it is depleted after about two hours. In addition, the wet etch attacks resist with the liability of exposing patterned TiN, and even the TiN patterned film is undercut at the silicon oxide/TiN interface.

Beyond the above limitations, another significant problem exists. Upon plasma ignition, polymer deposits over the whole wafer, inhibiting the etch. At elevated temperatures, as preferred in the prior art, in conjunction with ion bombardment, the polymer removal rate increases, so that etching initiates. However, the plasma power density is very high, typically 1 watt/cm$^3$, so the wafer temperature increases with increasing etch time. As such, the net polymer deposition:removal ratio gradually decreases, reducing the etch selectivity during the later phases of the etch. Therefore, it is very difficult to control the process when the etch rates change with time. Moreover, the etch resist will often "burn" or reticulate at the elevated temperatures, making it more susceptible to lift-off during the dry etch and wet etch, used to clear the sidewall material, possibly eliminating the feature or decreasing the critical dimension control of a very small linewidth.

SUMMARY OF THE INVENTION

Generally, this invention provides a method for etching a first material at a faster rate than a second material. In one form, the invention is used to form a local interconnect on a semiconductor workpiece.

The invention provides a method for selectively etching one material on a semiconductor workpiece faster than another. The method uses a plasma etcher. In one example, the material to be etched is titanium nitride while the other material is titanium silicide or a dielectric such as silicon dioxide. The workpiece is disposed in the plasma etcher and a multi-component reactant is flowed into the plasma etcher and over the surface. The reactant is chosen such that at least one component generates a non-volatile result and at least one other component generates a volatile result when combined with the material which is not to be etched. Examples of reactants are halogen bearing agents, such as chlorine bearing agents, fluorine bearing agents, and/or halohydrocarbons, and an oxidizing agent, such as oxygen, or a reducing agent such as hydrogen. The gas mixuture is then ignited to form plasma and the one material is etched faster than the other.

In one embodiment, a method for forming a local interconnect at a silicon surface is disclosed. The method comprises forming an insulating layer over a selected location of the surface and then forming a layer of titanium silicide in contact with the silicon surface at a location adjacent the insulating layer. An interconnect layer of a material comprising titanium is formed over the titanium silicide and the insulating layer. Next, a protective masking material, such as photoresist, is formed over a specific portion the interconnect layer to define an interconnect. The interconnect layer is then etched with a halogen bearing agent, such as carbon tetrachloride or carbon tetrafluoride, and an oxidizing agent, such as oxygen, or a reducing agent, such as hydrogen, in a plasma reactor to remove all of the interconnect layer except the defined interconnect.

An advantage of the invention is that it provides a method to improve the control of polymer deposition, having an impact on process latitude and etch properties. Also, for example, the etch process can be performed at lower substrate temperatures which can be sustained and will not drift in time. Both will improve the process latitude and stability. For example, lower power and/or higher pressure will allow for improved process characteristics such as etch rate, etch selectivity, and filament removal. These latitude and instability problems associated with the prior art make it very difficult to control the etch processes since the etch rates vary with substrate temperature which, in turn, is influenced by process power and pressure. The interactive nature of these physical variables cause even more process instability. In addition, because of the lower substrate temperatures, the etch resist will not be deformed or develop stress from reticulation, as sometimes occur in prior art methods.

BRIEF DESCRIPTION OF THE DRAWINGS

For a more complete understanding of the present invention, and for further advantages thereof, reference is now made to the following description taken in conjunction with the accompanying drawing in which:

FIG. 4 shows a flow diagram of the process of the invention.

Corresponding numerals and symbols in the different figures refer to corresponding parts unless otherwise indicated.

DETAILED DESCRIPTION OF PREFERRED EMBODIMENTS

Figure 1:
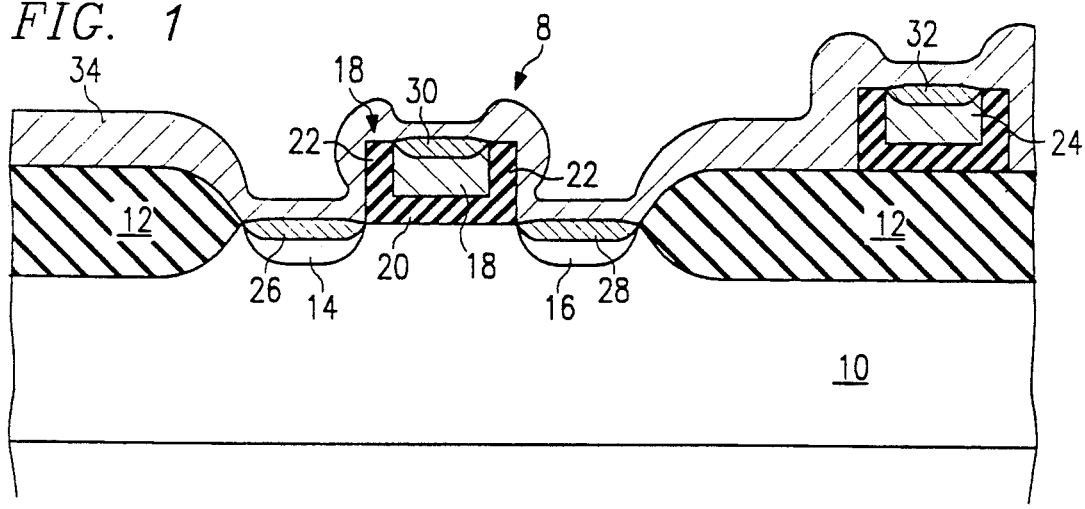
FIGS. 1-3 are greatly enlarged schematic views of an integrated circuit workpiece illustrating various steps of the disclosed etch for the embodiment of a local interconnect.

FIG. 1. shows the first step utilizing the method of the preferred embodiment of the present invention, as directed to an integrated circuit wafer 8. Wafer 8 contains a semiconducting substrate 10 formed of silicon. Field oxide 12, preferably silicon dioxide ($SiO_2$), is grown or deposited in selected portions of the surface of the substrate 10 for isolation of active regions from one another according to the well known local oxidation (LOCOS) isolation technique; of course, other isolation techniques such as trench isolation may alternatively be used. The active transistors of the integrated circuit device are formed into the locations of the surface of substrate 10 not covered with field oxide 12, such locations commonly called moat regions. In FIG. 1, a transistor is shown having source and drain regions 14 and 16, respectively, diffused into the moat region between two portions of field oxide 12. Source and drain regions 14 and 16 are generally implanted and subsequently diffused after the placement of polysilicon gate electrode 18 over gate dielectric 20, so the source and drain regions 14 and 16 are self aligned relative to gate electrode 18. The incorporation of sidewall oxide filaments 22 along the side of gate electrode 18 provide for a graded junctions, as shown in FIG. 1. FIG. 1 further illustrates a polysilicon layer 24 overlying field oxide 12 serving as an interconnect to another portion of the integrated circuit, for example extending to another moat region (not shown) and serving as the gate electrode for a transistor.

In this embodiment of the invention, source and drain regions 14 and 16, and gate electrodes 18 and 24, are clad with a refractory metal silicide such as titanium silicide. This cladding is performed by depositing a layer of the refractory metal, and subsequently heating the wafer 8 so that the metal directly reacts with the underlying silicon to form the silicide. An example of the conditions for such direct reaction is heating the wafer 8 in a nitrogen and argon ambient at a temperature on the order of 675° C. Other methods of achieving the direct reaction may alternatively be used, for example, by use of a single-wafer Rapid Thermal Processor (RTP) where the wafer 8 is rapidly heated to the appropriate temperature for a sufficient amount of time to perform the direct reaction described above.

As described in U.S. Pat. No. 4,675,073, where titanium is used as the refractory metal, as a result of the direct reaction process a layer of a conductive titanium compound covers the surface of the wafer 8, including the silicide regions. Referring to FIG. 1, source region 14, drain region 16, and gate electrodes 18 and 24 are shown clad with titanium silicide film 26, 28, 30, and 32, respectively. A layer 34, of residual material containing, for example, titanium nitride if the direct reaction is performed in a nitrogen atmosphere, remains over the surface; if a layer of oxide (not shown) is provided over the top of the titanium metal layer prior to the direct reaction, layer 34 may contain titanium oxide. Layer 34 will have a thickness on the order of 100 nm over field oxide 12, and will be thinner (e.g., on the order of 40 nm thick) in the locations over silicide film 26, 28, 30, and 32. If desired, the thickness of layer 34 may be increased by a second deposition of titanium metal after the initial direct reaction, followed by a second direct reaction in a nitrogen atmosphere.

Figure 2:
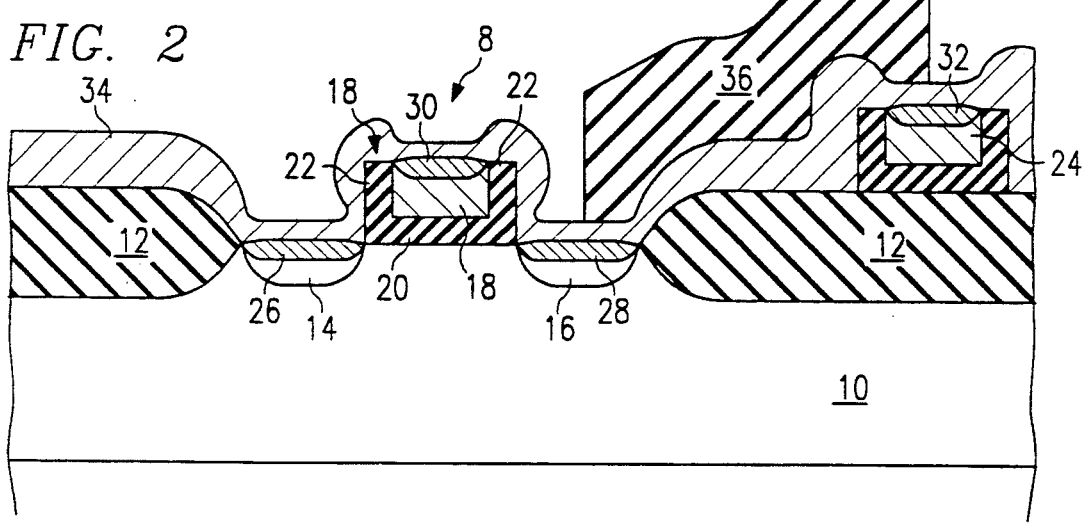

Referring to FIG. 2, the next step in the preferred embodiment of the present invention is illustrated. A layer of masking material is deposited over layer 34, and is patterned according to conventional techniques to remain in the locations of the eventual local interconnect, as shown by patterned masking material 36 in FIG. 2. The masking material 36 serves to protect the covered portion of layer 34 from subsequent etching. The patterned masking material 36 may be photoresist, or a hard mask material such as silicon dioxide. Prior the beginning the etching process, it may be desirable to clean the substrate as described in U.S. Pat. No. 4,863,559.

After patterning masking material 36, wafer 8 is placed in any appropriate plasma etching device such as plasma mode etcher, a reactive ion etcher or a microwave after glow, which are well known in the art. This step is illustrated as the first step 100 in the flow diagram of FIG. 4. In the preferred embodiment, a plasma mode etcher is utilized. The plasma mode etcher comprises a symmetrical parallel plate reactor with the substrate typically grounded, and functions in the plasma mode with typically little or no DC bias on the powered electrode. The powered top plate comprises graphite or titanium, and the bottom plate may comprise bare aluminum. The plates are spaced approximately one centimeter apart, and approximately 100 watts of power is applied. Radio Frequency (RF) energy is transmitted between the plates by an RF generator. The powered electrode also serves as a gas dispersal source similar to a shower head.

Referring again to FIG. 4, the second step 102 in the flow diagram is to flow an agent or combination of agents to serve as an etchant into the etcher and onto the surface. According to the invention, these compounds are used as the dry etch reactants in the plasma mode etcher. One group of etchants are the halogen bearing agents. Oxidizing or reducing agents may also be included in the reaction. Examples of halogen bearing agents are the large body of halocarbons and halohydrocarbons, including chlorine bearing agents, such as carbon tetrachloride ($CCl_4$), chloroform ($CHCl_3$), methylene chloride ($CH_2Cl_2$), methyl chloride ($CH_3Cl$), or trichlorethane ($C_2H_3Cl_3$), or fluorine bearing agents such as carbon tetrafluoride ($CF_4$), or other compounds such as nitrogen trifluoride ($NF_3$), nitrogen trichloride ($NCl_3$), or sulfer hexafluoride ($SF_6$). In theory, one could also use methane ($CH_4$); however, this is typically avoided due to the explosive reactions possible when combining methane and oxygen. The oxidizing agent can be oxygen ($O_2$), nitrogen dioxide ($NO_2$), or carbon dioxide ($CO_2$). The reducing agent can be hydrogen ($H_2$), ammonia ($NH_3$), hydrogen chloride (HCl), or water ($H_2O$). An inert gas such as helium (He) or nitrogen ($N_2$) can also be included for plasma stability and for improving the etch characteristics.

As an example, the proposed chemistry controls the plasma chemistry by altering the chlorine-to-carbon ratio by adjusting the ratio of the concentrations of the etchant species and/or by adjusting the reducing or oxidizing ambient to which the etchant species and their dissociated products are exposed. In this manner, the tendency to form chlorocarbon and chlorohydocarbon polymer films, for example, can be manipulated to adjust etch selectivity, among other responses. For example, $CHCl_3/CCl_4/O_2/He$ or $CHCl_3/O_2/He$ or $CCl_4/O_2/He$ or $CCl_4/H_2/He$ or $CCl_4/HCl/He$ etchant combinations can be used to etch TiN with selectivity to $TiSi_2$ (i.e., TiN etches faster than $TiSi_2$). Again, the common factor among these and other combinations is control of polymerization by adjusting the Cl:C ratio for a given reducing or oxidizing environment. The reducing or oxidizing environment, in turn, is controlled by the $O_2$ or $H_2$ concentrations, for example. As the Cl:C ratio decreases from four to two, polymerization will increase. For a given ratio, polymerization will decrease for higher $O_2$ flows and increase for higher $H_2$ flows. For example, $CCl_4$ mildly polymerizes with a 4:1 ratio; however $CHCl_3$ will deposit heavy polymer films with a 3:1 ratio and hydrogen liberation.

In the preferred embodiment, for example, by manipulating the degree of polymerization, as described above, the etch properties can be determined, since the polymer film can be removed or formation inhibited on the TiN surface by reaction on the TiN surface to form cyanogen (CN) and $TiCl_x$ products. But, polymerization is not inhibited on $TiSi_2$, since the carbides of Ti and Si are not very volatile, i.e., not readily evaporated, if found, and hence, can not be chemically removed from the $TiSi_2$ surface by polymerizing the carbon species. In this manner, a $TiN:TiSi_2$ etch rate ratio greater than unity can be achieved. This model is useful for etching titanium materials, due to the higher volatility of titanium chlorides versus titanium fluorides.

In general this plasma chemistry is useful for etching many materials that have products exhibiting volatility as halides, such as chlorides, fluorides, bromides and iodides, or as hydrides. This chemistry should exhibit etch selectivity between many pairs of materials, wherein only one material of the pair contains an agent that reacts with carbon to form a reaction product exhibiting sufficient volatility to allow further reaction etching. One example is to etch tungsten dinitride ($WN_2$) more quickly than silicon.

Although the mechanism of carbonaceous polymerization to passivate a surface toward etching is effective, simple product build up can achieve etch selectivity between two materials if one surface contains an agent to volatize a plasma reactant and the other surface does not. For example, $NF_3$ might be used to etch a surface containing nitrogen or oxygen with selectivity to a surface without these elements since $N_2$ or NO are both gaseous at room temperature. Other examples of a non-polymerizing etch with selectivity by product build up are $H_2O$ and $NCl_3$.

By emphasizing the chemical aspects of polymerization and reducing the influence of ion bombardment, the polymer buildup will be more equitable for surfaces normal and parallel to the plasma. Consequently, in the local interconnect preferred embodiment the conductive filament, thought to be comprised of $TiSi_xO_y$, is easier to remove during the dry etch. As a result, no wet etch is necessary. Moreover, process parameter latitude is not limited to satisfy certain physical processes in the plasma, so etch properties can be improved and adjusted to meet fabrication requirements by using a larger domain of variables and variable values. The process is also more reliable than the prior art, not just because it can deliver improved etch properties that allow for more processing latitude with respect to incoming material, but also because the process is decoupled from small changes in the reactor hardware, e.g., wafer contact with the substrate, RF conduction, and parasitic discharges and capacitances, that influence physical processes with the plasma.

Referring once again to FIG. 4, the third step 104 in the preferred embodiment is to ignite the reaction. As an example, consider a chlorocarbon etchant. In order to initiate the plasma, it is necessary to detach electrons from the chlorocarbon anions present in the plasma gas. Because neutral chlorocarbon species have high cross-sections for electron attachment, the reaction chamber tends to become depleted of free electrons, which are crucial to the ignition of the plasma by the mechanism of elctron-impact ionization of other atomic and molecular species. Such electron-impact ionization is generally required to ignite the plasma once the avalanche condition is reached. As is well known in the art, the electron is an important charged species in plasma ignition since its low mass allows it to be sufficiently energized by an RF electric field to ionize a neutral species.

A useful method according to the invention for generating sufficient free electrons to ignite the plasma is to illuminate the reaction chamber with a light source, with the light having a wavelength in the range of 180 to 1200 nanometers. In the preferred embodiment, an intense emission in the ultraviolet end of the spectrum, such as from a mercury/argon light source, will photodetach electrons from anions in the plasma, such anions having a high cross-section for photoelectric detachment. Hence, the light source illumination effectively provides a sufficient free electron concentration by photodetachment from the anions to permit facile plasma ignition. Alternative techniques for replenishing the free electron concentration for otherwise detaching electrons, by introducing new electrons from an auxiliary source or by temporarily increasing the power of operation to increase the electron energy of a deficient concentration of electrons, can also be used for facilitating ignition.

The final step in the preferred embodiment is to perform the etch. This illustrated as step 106 in FIG. 4. It should be noted that the etching step can be performed even at temperatures as low as or below 0° C. This is an advantage over the prior art. One advantage is that the lower temperature helps to maintain the integrity of the masking material 36.

Figure 3:
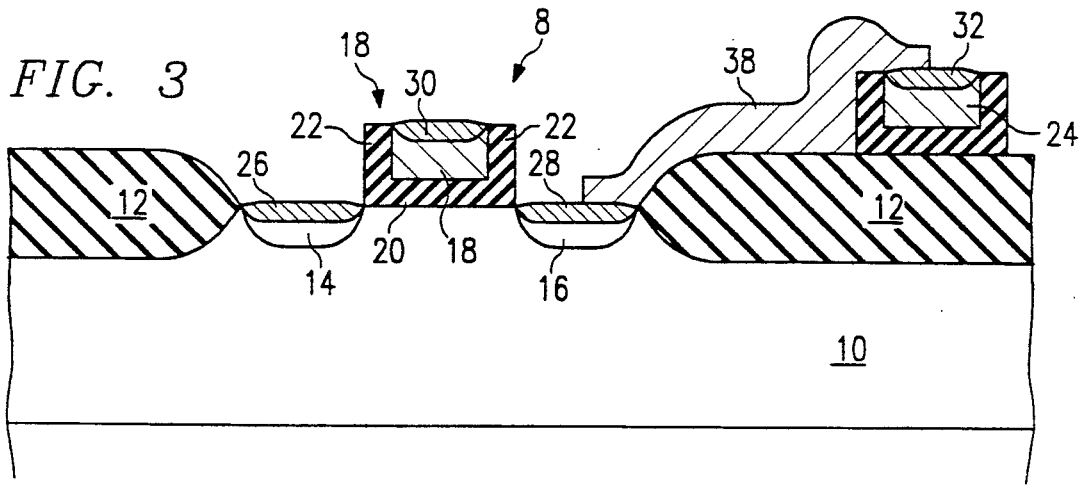

After completion of the desired etching steps, patterned masking material 36 is removed by an appropriate method, such as a solvent resist strip for photoresist, as is well known in the art. After the removal of the masking material 36, the structure thus appears substantially as shown in FIG. 3, with local interconnect 38 exposed as the remaining portion of layer 34. The illustrated example of local interconnect 38 extends from drain region 16, contacting silicide film 22 thereat, to contact silicide film 32 located upon gate electrode 24. Local interconnects such as local interconnect 38 can also be used to contact diffused regions to one another, gate electrodes to one another, and also to provide a barrier metal to which contact vias may be etched in providing metal-to-diffusion and metal-to-polysilicon contacts. It should be noted that the compounds described herein for local interconnect 38, such as titanium nitride and titanium oxide, act substantially as a diffusion barrier to phosphorous, thereby allowing contact between phosphorous-doped n-type silicon and p-type silicon with the problem of outdiffusion of the n-type dopant through the interconnect 38 into the p-type semiconductor.

A specific example of the invention is provided hereinbelow. In the example, the above described process was used to etch a wafer with a moat-to-moat filament structure comprised of 3000 common gate straps. The current was measured at ±0.5 volts. The process conditions were as follows:

|  |  |
| --- | --- |
| Carbon tetrachloride flow | 105 SCCM |
| Chloroform flow | 30 SCCM |
| Oxygen flow | 5 SCCM |
| Helium | 30 SCCM |
| Power | 100 Watts |
| Pressure | 600 mTorr |
| Temperature | 20° C. |

The resultant currents, measured at 0.5 volts with 100% overetch were:

|  |  |
| --- | --- |
| Moat-to-Moat Current | $450 \times 10^{-12}$ Amperes |
| Poly-to-Moat Current | $10 \times 10^{-12}$ Amperes |

Here, the TiN:TiSi$_2$ ratio was measured at approximately 10:1.

A few preferred embodiments have been described in detail hereinabove. It is to be understood that the scope of the invention also comprehends embodiments different from those described, yet within the scope of the claims.

What is claimed is:

1. A method for selectively etching a first material at a faster rate than a second material, wherein both materials are incorporated on the surface of a semiconductor workpiece, comprising the steps of:
   disposing the surface within a plasma etcher;
   flowing a multi-component reactant into the etcher, such that at least one component generates a non-volatile, polymerizing result with the second material while at least one other component generates a volatile result with the first material;
   simultaneously flowing a controlling reagent into the etcher, wherein said controlling reagent controls the build-up of said non-volatile, polymerizing result;
   igniting the reactant to form plasma;
   etching said first material with said plasma.

2. The method of claim 1, wherein said reactant comprises a halogen bearing agent.

3. The method of claim 2, wherein said halogen bearing agent comprises a chlorine bearing agent.

4. The method of claim 3, wherein said chlorine bearing agent comprises a carbon tetrachloride.

5. The method of claim 3, wherein said chlorine bearing agent comprises a combination of carbon tetrachloride and chloroform.

6. The method of claim 2, wherein said halogen bearing agent comprises a fluorine bearing agent.

7. The method of claim 1 wherein said controlling reagent comprises an oxidizing agent.

8. The method of claim 1 wherein said controlling reagent comprises a reducing agent.

9. The method of claim 1, wherein said step of flowing further comprises the step of flowing helium into the plasma etch.

10. The method of claim 1, wherein said first material comprises a titanium compound.

11. The method of claim 1, wherein said first material comprises tungsten dinitride and said second material comprises silicon.

12. The method of claim 1, wherein said first material comprises titanium nitride and said second material comprises titanium silicide.

13. The method of claim 1, wherein said second material comprises silicon dioxide.

14. The method of claim 1, wherein said second material comprises an organic resin.

15. A method for forming a local interconnect at a silicon surface, comprising the steps of:
   forming an insulating layer over a selected location of said surface;
   forming a layer of titanium silicide in contact with the silicon surface at a location adjacent said insulating layer;
   forming an interconnect layer of material comprising titanium over said titanium silicide and said insulating layer;
   forming a protective masking material over a specific portion of said interconnect layer to define an interconnect;
   etching said interconnect layer with a halogen bearing agent and a controlling agent chosen from the group consisting of oxidizing agents and reducing agents in a plasma reactor to remove all of said interconnect layer except said defined interconnect.

16. The method of claim 15, wherein said steps of forming said titanium silicide layer and said interconnect layer comprise:

depositing a layer of titanium over the silicon surface and said insulating layer;

reacting said titanium in a nitrogen and argon ambient at a temperature sufficient to cause the titanium layer to react with said silicon surface to form a layer of titanium silicide covered with a layer of titanium nitride, and to form layer of titanium nitride over said insulating layer.

17. The method of claim 15, wherein said halogen bearing agent comprises carbon tetrachloride.

18. The method of claim 15, wherein said oxidizing agent comprises oxygen.

19. The method of claim 15, wherein said reducing agent comprises hydrogen.

20. A method for dry etching a conductive titanium chemical compound formed over a dielectric or a silicide on a semiconductor surface, comprising the steps of:

disposing the semiconductor surface within a plasma etcher;

flowing a halogen bearing agent into said plasma etcher and over the semiconductor surface;

simultaneously flowing a controlling reagent into the plasma etcher and over the semiconductor surface;

igniting said halogen bearing agent to form plasma; and etching the titanium chemical compound with said plasma without undesirably etching the dielectric or silicide from the semiconductor surface.

21. The method of claim 20 wherein:

said halogen bearing agent is chosen from the group consisting of chlorine bearing agents and fluorine bearing agents; and said controlling reagent is chosen from the group consisting of oxiding agents and reducing agents.

* * * * *